United States Patent
Lu

(10) Patent No.: US 10,110,165 B2
(45) Date of Patent: Oct. 23, 2018

(54) SOLID STATE MICROWAVE GENERATOR

(71) Applicant: Seagate Technology LLC, Cupertino, CA (US)

(72) Inventor: Bin Lu, San Ramon, CA (US)

(73) Assignee: Seagate Technology LLC, Cupertino, CA (US)

( * ) Notice: Subject to any disclaimer, the term of this patent is extended or adjusted under 35 U.S.C. 154(b) by 120 days.

(21) Appl. No.: 15/276,802

(22) Filed: Sep. 27, 2016

(65) Prior Publication Data

US 2017/0338829 A1    Nov. 23, 2017

Related U.S. Application Data

(63) Continuation-in-part of application No. 15/237,081, filed on Aug. 15, 2016.

(60) Provisional application No. 62/339,026, filed on May 19, 2016.

(51) Int. Cl.
| | | |
|---|---|---|
| *G01R 33/09* | (2006.01) | |
| *H03B 15/00* | (2006.01) | |
| *H03L 7/26* | (2006.01) | |
| *H03B 5/00* | (2006.01) | |
| *G01R 33/02* | (2006.01) | |

(52) U.S. Cl.
CPC ............ *H03B 5/00* (2013.01); *G01R 33/0213* (2013.01); *G01R 33/093* (2013.01); *H03B 15/006* (2013.01); *H03L 7/26* (2013.01)

(58) Field of Classification Search
CPC .. G01R 33/02; G01R 33/0213; G01R 33/035; G01R 33/0352; G01R 33/0354; G01R 33/06; G01R 33/09; G01R 33/093; H03B 15/00; H03B 15/006; H03L 7/26

USPC ............................................... 331/94.1
See application file for complete search history.

(56) References Cited

U.S. PATENT DOCUMENTS

| | | | |
|---|---|---|---|
| 8,098,105 B2 | 1/2012 | Cyrille et al. | |
| 8,421,545 B2 | 4/2013 | Kim et al. | |
| 8,471,640 B2 | 6/2013 | Choi et al. | |
| 8,598,957 B2 | 12/2013 | Lee et al. | |
| 8,754,717 B2 | 6/2014 | Lee et al. | |
| 8,847,692 B2 | 9/2014 | Pi et al. | |
| 9,088,243 B2 | 7/2015 | Tulapurkar et al. | |
| 9,461,586 B2 | 10/2016 | Locatelli et al. | |
| 9,660,582 B2 | 5/2017 | Wang et al. | |
| 9,762,182 B2 * | 9/2017 | Suzuki | H03B 15/006 |
| 2008/0080100 A1 * | 4/2008 | Sato | B82Y 10/00 360/324 |
| 2009/0201614 A1 * | 8/2009 | Kudo | B82Y 25/00 360/324.11 |

(Continued)

OTHER PUBLICATIONS

P M Braganca et al. 2010 "Nanotechnology" 21 235202.*

*Primary Examiner* — Levi Gannon

(57) ABSTRACT

An apparatus includes a spin torque oscillator, a sensor, and a processing unit. The spin torque oscillator is configured to receive a current and to generate a microwave output signal. The sensor is configured to detect the microwave output signal and to detect changes to frequency of the detected microwave output signal responsive to changes in an external magnetic field. The processing unit is configured to receive a sensed signal from the sensor. The processing unit is further configured to process the sensed signal and the changes to the frequency to determine magnitude and direction associated with the external magnetic field.

23 Claims, 9 Drawing Sheets

(56) References Cited

U.S. PATENT DOCUMENTS

| | | | |
|---|---|---|---|
| 2010/0079919 A1* | 4/2010 | Nagasawa | B82Y 25/00 360/324.1 |
| 2010/0142088 A1 | 6/2010 | Iwasaki et al. | |
| 2010/0328799 A1* | 12/2010 | Braganca | B82Y 25/00 360/31 |
| 2011/0141629 A1* | 6/2011 | Braganca | B82Y 25/00 360/313 |
| 2012/0126904 A1* | 5/2012 | Lee | H03B 15/006 331/46 |
| 2012/0218667 A1 | 8/2012 | Nagasawa et al. | |
| 2013/0009712 A1* | 1/2013 | Braganca | G01R 33/093 331/94.1 |
| 2013/0148223 A1* | 6/2013 | Braganca | G11B 20/10018 360/30 |
| 2014/0168812 A1* | 6/2014 | Braganca | G01R 33/00 360/75 |
| 2015/0372687 A1 | 12/2015 | Buhrman et al. | |

* cited by examiner

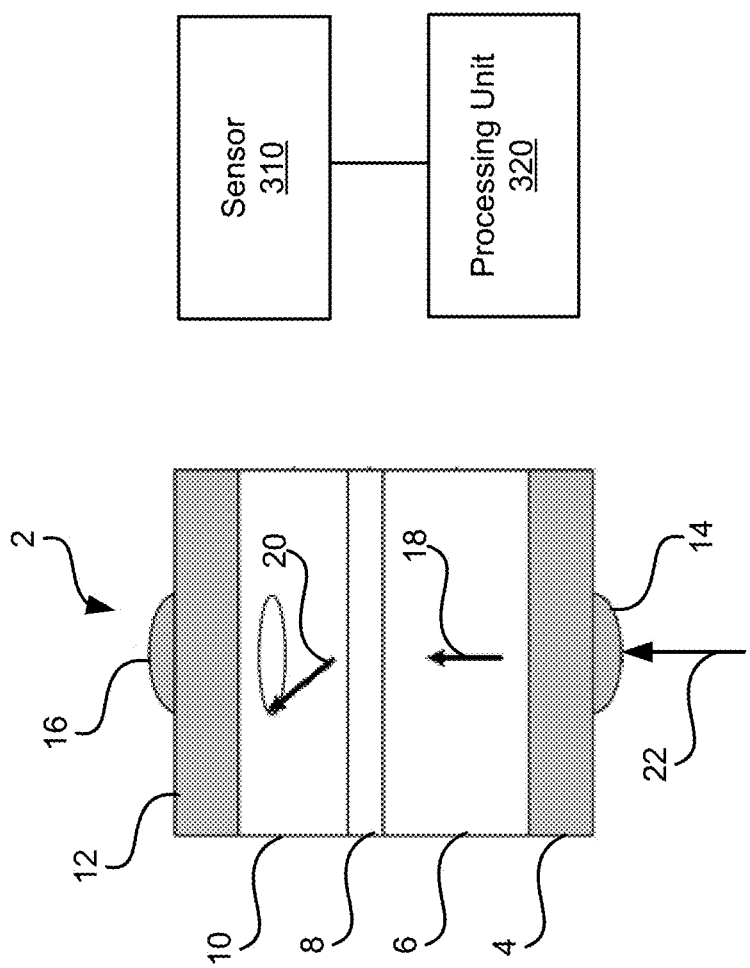

SOLID STATE MICROWAVE GENERATOR

RELATED APPLICATIONS

The instant application is a continuation in part and claims the benefit and priority to the U.S. patent application Ser. No. 15/237,081 filed on Aug. 15, 2016, which claims the benefit and priority to the U.S. Provisional Patent Application No. 62/339,026 filed on May 19, 2016, which are incorporated in their entirety by reference.

BACKGROUND

Solid state microwave oscillators are used as sensors, communication sources, and measuring instruments in a wide variety of applications, such as, for example, radio communications, military and commercial radar sources, anti-lock brakes, airborne collision avoidance radar, traffic flow monitoring, automatic traffic gates, process control equipment, alarms, train derailment sensors, vibration detectors, tachometers, and moisture content monitors, to name just a few. The use of sensors has become prevalent in every day use and throughout the industry. For example, thin film magnetic sensors are used in military or consumer applications and they use Hall effect, magneto-resistance (CMR) effect, or giant-resistance (GMR) effect.

SUMMARY

An apparatus includes a spin torque oscillator, a sensor, and a processing unit. The spin torque oscillator is configured to receive a current and to generate a microwave output signal. The sensor is configured to detect the microwave output signal and to detect changes to frequency of the detected microwave output signal responsive to changes in an external magnetic field. The processing unit is configured to receive a sensed signal from the sensor. The processing unit is further configured to process the sensed signal and the changes to the frequency to determine magnitude and direction associated with the external magnetic field. These and various other features and advantages will be apparent from a reading of the following detailed description.

BRIEF DESCRIPTION OF THE DRAWINGS

FIG. 1A illustrates a schematic diagram of magnetic field detection using a spin torque oscillation generator and a sensor according to one aspect of the present description.

DETAILED DESCRIPTION

Figure 1B:
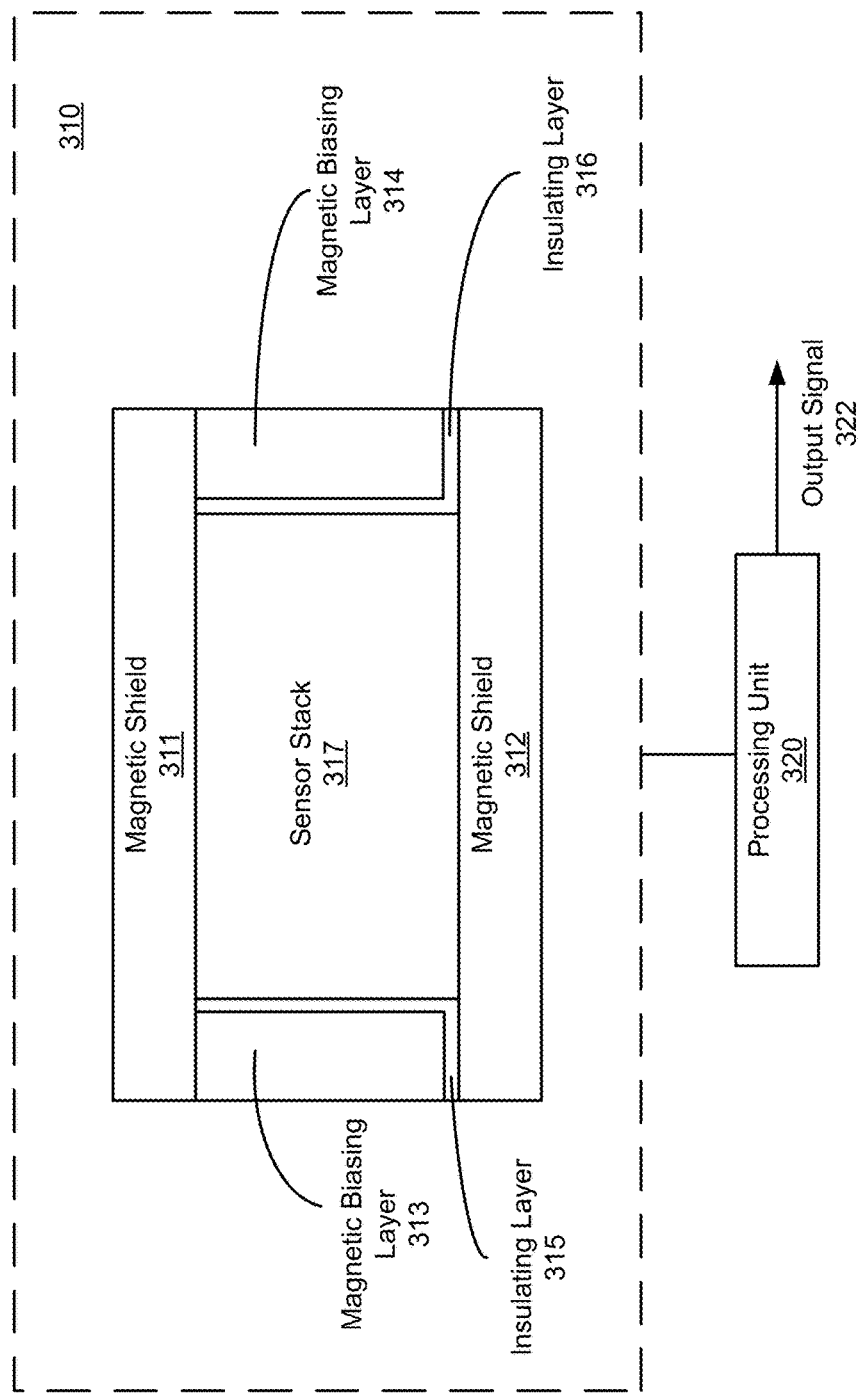
FIG. 1B-1C illustrate a schematic diagram of a sensor according to one aspect of the present description.

Before some particular embodiments are described in greater detail, it should be understood by persons having ordinary skill in the art that the particular embodiments described and/or illustrated herein do not limit the concepts presented herein, as elements in such particular embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing some particular embodiments, and the terminology does not limit the concepts presented herein. Unless indicated otherwise, ordinal numbers (e.g., first, second, third, etc.) are used to distinguish or identify different elements or steps in a group of elements or steps, and do not supply a serial or numerical limitation. For example, "first," "second," and "third" elements or steps of embodiments need not necessarily appear in that order, and embodiments need not necessarily be limited to the three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art.

In various embodiments, a magnetic sensor utilizing spin torque effect is disclosed. The magnetic sensor may include solid state microwave generator. The solid state microwave generator includes a spin reference layer and a spin oscillation layer. The spin reference layer is a permanent magnetic layer having a first magnetization direction. The spin reference layer receives a current and generates a spin-polarized current. The spin polarized current is provided to the spin oscillation layer. The spin oscillation layer is a magnetic layer having a second magnetization direction. The spin-polarized current generates a spin torque on the spins of the spin oscillation layer. The spin torque causes the spins of the spin oscillation layer to precess. The precession of the spins outputs a microwave signal. The sensor receives the microwave output signal. Presence of external magnetic field changes the frequency of the microwave output signal. The resistance across the sensor stack also changes in response to the external magnetic field and is related to the changes in frequency. Accordingly, measuring the changes in resistance is used in determining the magnitude and orientation of the external magnetic field. As such, sensitivity of the sensor is improved. Moreover, the strength of the microwave output signal can be adjusted by using a number of microwave generators, thereby enabling one to adjust the sensitivity even further.

Referring now to FIG. 1A, a schematic diagram of magnetic field detection using a spin torque oscillation generator and a sensor in accordance with some embodiments is shown. The spin torque oscillation generator 2 includes a first electrode 4 configured to receive a current 22. A contact 14 can be formed on the first electrode 4. The contact 14 is configured to couple the first electrode 4 to one or more additional circuit elements, such as, for example, a current source. The first electrode 4 comprises a conductive material configured to pass the current 22 from the contact 14 to one or more additional layers. For example, in various embodiments, the first electrode 4 can comprise any suitable material such as a silver-alloy, a copper alloy, a gold alloy, an aluminum alloy, and/or any other suitable material having a high electrical conductivity. In some embodiments, the current 22 has a high current density. For example, in some embodiments, the current 22 has a current density of about $10^7$ A/cm$^2$, although it will be appreciated that a greater and/or lesser current density can be used and is within the scope of this disclosure. A spin reference layer 6 is formed above the first electrode 4 and receives a current 22 from the first electrode 4. In the illustrated embodiment, the spin reference layer 6 is formed directly above the first electrode 4, although it will be appreciated that one or more additional layers can be formed between the first electrode 4 and the spin reference layer 6.

In some embodiments, the spin reference layer 6 includes a permanent magnetic material having a first magnetization direction 18. The first magnetization direction 18 generates an energy band/preference in the spin reference layer 6. The spin reference layer 6 receives a current 22 from the first electrode 4 and generates a spin-polarized current based on the energy band/preference. In some embodiments, the spin-polarized current is generated by filtering electrons passing through the spin reference layer 6 such that electrons having a spin direction substantially similar to the first magnetization direction 18 are passed through the spin reference layer 6 and electrons having a spin direction substantially opposite the first magnetization direction 18 are not-passed through (e.g., reflected back or scattered). This filtering generates a spin-polarized current having a spin polarization direction substantially equal to the first magnetization direction 18.

The spin reference layer 6 can comprise any suitable permanent magnetic material. In some embodiments, the spin reference layer 6 includes a hard permanent magnetic material configured to maintain a predetermined first magnetization direction 18 in the presence of an external magnetic field (see FIG. 3). For example, the spin reference layer 6 can comprise an $L1_0$-phased hard magnetic alloy, such as FePt, FePtX, CoPt, CoPtX, FePd, FePdX, CoPdX, where X is any other suitable additional element(s), and/or any other suitable element. The spin reference layer 6 can be formed into arrays by any suitable formation method, such as bit-pattern media technology, although it will be appreciated that the spin reference layer 6 can be formed by one or more additional and/or alternative methods, for example, lithographic methods.

In some embodiments, the spin torque oscillation generator 2 includes an exchange breaking layer 8 formed above the spin reference layer 6. The exchange breaking layer 8 is configured to pass the spin-polarized current (i.e., pass spin-polarized electrons) from the spin reference layer 6 to one or more additional layers, such as a spin oscillation layer 10, formed above the exchange breaking layer 8. The exchange breaking layer 8 further breaks a magnetic exchange/coupling between the spin reference layer 6 and one or more additional layers, such as the spin oscillation layer 10. The exchange breaking layer 8 includes a conducting, nonmagnetic or weak magnetic material, such as, for example, a copper-alloy, a silver-alloy, a gold-alloy, and/or any other suitable conducting, nonmagnetic or weak magnetic alloy. The exchange breaking layer 8 can be formed by any suitable formation method, such as bit-pattern media technology, although it will be appreciated that the exchange breaking layer 8 can be formed by one or more additional and/or alternative methods. In some embodiments, the exchange breaking layer 8 can include a diffusion barrier layer (not shown). Although the exchange breaking layer 8 is illustrated directly above the spin reference layer 6, it will be appreciated that one or more additional layers can be formed between the spin reference layer 6 and the exchange breaking layer 8.

In some embodiments, a spin oscillation layer 10 is formed on top of the exchange breaking layer 8. The spin oscillation layer 10 includes a permanent magnetic layer having a second magnetization direction 20. The second magnetization direction 20 is different than the first magnetization direction 18. The spin oscillation layer 10 receives the spin-polarized current from spin reference layer 6, for example, through the exchange breaking layer 8. When the spin-polarized current arrives in the spin oscillation layer 10, the spin-polarized current generates a spin torque in the spins of the oscillation layer 10. The spin torque is dependent on a magnetization angle difference between the second magnetization direction 20 and the spin direction of the spin-polarized current, i.e., the first magnetization direction 18. The spin torque causes precession of the spins within the spin oscillation layer about a film normal of the spin oscillation layer 10. The precession of the spins generates an electromagnetic (EM) wave output signal. The magnetization angle difference between the first magnetization direction 18 and the second magnetization direction 20 can be any suitable angle, for example, any angle within a range of 0° and 90°, such as 5°, 10°, 15°, 30°, 45°, 60°, 75°, 80°, 85°, 90°, a range of 0° and 180°, such as 5°, 10°, 15°, 30°, 45°, 60°, 75°, 80°, 85°, 90°, 105°, 135°, 150°, 180°, and/or any other suitable angle or range of angles. The spin torque can be further dependent on the current density of the spin-polarized current (e.g., the current density determines the strength and frequency of the spin torque output signal). In some embodiments, the spin torque output signal is a microwave signal.

In some embodiments, the second magnetization direction 20 of the spin oscillation layer 10 is determined by an external magnetic field applied to the spin oscillation layer 10. For example, the spin oscillation layer 10 can include a soft magnetic material and/or a negative magnetic anisotropy (Ku) material, such as a nickel alloy (e.g., NiFe, NiCo, NiFeCo), an iron alloy (e.g., FeCo), a cobalt alloy, (e.g., Colr), and/or any other suitable soft magnetic and/or negative Ku material. Applying an external magnetic field to a soft magnetic material and/or a negative Ku material causes a change in the second magnetization direction 20. For example, in some embodiments, the second magnetization direction 20 aligns at an angle with respect to a film normal when an external magnetic field is applied perpendicular to the film plane. It will be appreciated that the material of the spin oscillation layer 10 can be selected to achieve any desired orientation of the second magnetization direction 20. A frequency of the spin torque output signal can be tuned dynamically by adjusting a current density of the spin-polarized current. In some embodiments, the frequency of the spin torque output signal is further determined by magnetic properties and magnetic configurations of the spin reference layer 6 and/or the spin oscillation layer 10. It is, however, appreciated that presence of an external magnetic field affects the frequency of the spin torque output signal, the frequency of which is detected and measured using the sensor 310 and the processing unit 320 discussed below.

A second electrode 12 is formed on top of the spin oscillation layer 10. The first electrode 4 and/or the second electrode 12 can be formed of any suitable material. For example, the first electrode 4 and/or the second electrode 12 can include a silver alloy, a copper alloy, a gold alloy, an aluminum alloy, and/or any other suitable material having a high electrical conductivity. In some embodiments, the first electrode 4 and/or the second electrode 12 include a seed layer having a face-centered cubic (FCC) structure, a body-centered cubic (BCC) structure, a hexagonal close-packed structure (HCP) and/or any other suitable structure. The seed layer is configured to assist in growth of one or more of the spin reference layer 6, the exchange breaking layer 8, and/or the spin oscillation layer 10.

The sensor 310 receives the generated microwave output signal, e.g., through a receiver (not shown here). Current associated with the received microwave output signal is generated and fed through the magnetic layers of the sensor 310. A change in the precessional oscillation frequency of a magnetization of a magnetic layer of the sensor 310 when the current associated with the received microwave output signal is applied is measured to determine the magnitude of the external magnetic field. It is appreciated that the current associated with the received microwave output signal results in the precessional oscillation frequency of the magnetization of the magnetic layer of the sensor 310 in presence and in absence of the external magnetic field. The precessional oscillation frequency is used by the processing unit 320 to determine the magnitude of the external magnetic field. Determining the change in the precessional oscillation frequency of a magnetization of a magnetic layer of the sensor 310 is described in more detail with respect to FIGS. 1B and 1C. The processing unit 320 may use additional information, e.g., positioning of the sensor 310 with respect to the spin torque oscillation generator 2, orientation of the sensor 310 with respect to the spin torque oscillation generator 2, distance of the sensor 310 to the spin torque oscillation generator 2, the expected strength of the microwave output signal from the spin torque oscillation generator 2, etc., to more accurately determine the magnitude and orientation of the external magnetic field. It is appreciated that the embodiment disclosing one sensor 310 is for illustration purposes and should not be construed as limiting the scope of the embodiments. For example, more than one sensor may be used and positioned in various distances from the spin torque oscillation generator 2 and in different orientation angle. It is appreciated that the processing unit 320 may be a controller, a processor, an application specific integrated circuit (ASIC), a field programmable gate array (FPGA), etc.

Referring now to FIG. 1B provide a schematic diagram of a sensor 310 and a processing unit 320 in accordance with some embodiments is shown. The sensor 310 may receive and detect the microwave output signal. Data related to the detected microwave output signal may be transmitted to the processing unit 320 in order to determine the magnitude of the external magnetic field. It is appreciated that the processing unit 320 may be coupled to the sensor 310, e.g., via one or more of the electrodes such as magnetic shields 311 and/or 312. In some embodiments, the processing unit 320 may further determine the orientation of the external magnetic field.

The sensor 310 includes electrodes 311 and 312, a sensor stack 317 disposed between the electrodes 311-312, magnetic biasing layers 313-314, and insulating layers 315-316. It is appreciated that the electrodes 311 and 312 are electrically conductive, e.g., NiFe, etc., and they may serve as magnetic shield for the sensor stack 317 as well. According to some embodiments, the sensor 310 receives the generated output microwave signal, e.g., via a receiver, etc., and induces an electrical current through the sensor stack 317 through an electrode, e.g., magnetic shield 312.

One or more layers within the sensor stack 317 may be biased in parallel with the external magnetic field through the biasing layers 313-314. It is appreciated that the biasing layers 313-314 are isolated from one or both electrodes 311 and 312 via the insulating layers 315-316. Spin polarization of electrons through the sensor stack 317 causes spin torque induced precession of the magnetization of a layer within the sensor stack 317.

The modulation of the oscillation frequency is measured to determine the magnitude of the external magnetic field. The modulation of the oscillation frequency is measured, for example, by measuring the change in the electrical resistance of the sensor stack 317. It is appreciated that the resistance of the sensor stack 317 or layers thereof changes in response to changes in the external magnetic field, e.g., magnitude, orientation or any combination thereof.

In some embodiments, the processing unit 320 may be expecting a particular resistance value associated with the sensor stack 317 based on the expected generated microwave output signal, e.g., strength, frequency, etc., by the spin torque oscillation generator 2. However, in presence of the external magnetic field, the measured resistance associated with the sensor stack 317 changes. The change in electrical resistance is related to the change in frequency of the microwave output signal and is used by the processing unit 320 to determine the magnitude of the external magnetic field.

Furthermore, the processing unit 320 may use additional information, e.g., positioning of the sensor 310 with respect to the spin torque oscillation generator 2, orientation of the sensor 310 with respect to the spin torque oscillation generator 2, distance of the sensor 310 to the spin torque oscillation generator 2, the expected strength of the microwave output signal from the spin torque oscillation generator 2, etc., to more accurately determine the magnitude and orientation of the external magnetic field. The determined magnitude of the external magnetic field and/or its orientation as determined by the processing unit 320 is output by the processing unit 320 via the output signal 322.

Figure 1C:
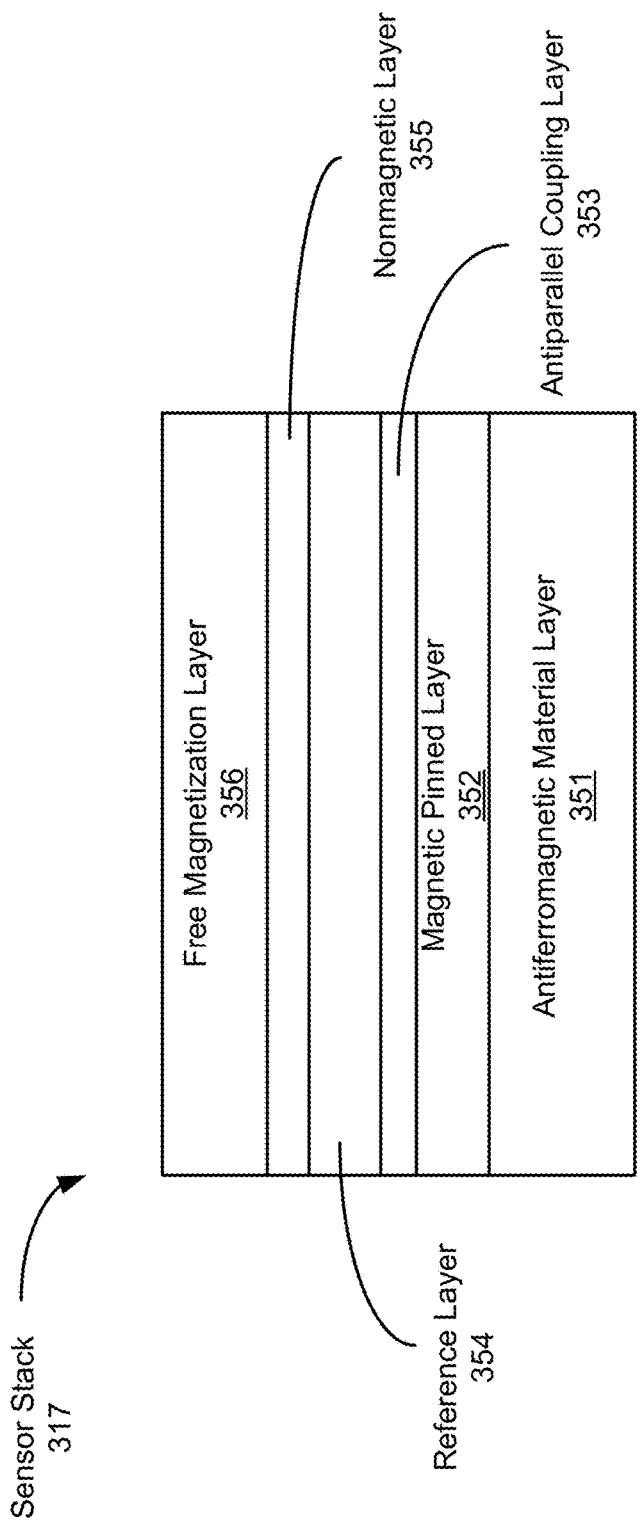

Referring now to FIG. 1C, the sensor stack 317 according to some embodiments is shown. The sensor stack 317 may include an antiferromagnetic material layer 351, a magnetic pinned layer 352, antiparallel coupling layer 353, a reference layer 354, a nonmagnetic layer 355, and a free magnetization layer 357. The magnetic pinned layer 352 and the reference layer 354 may include material such as CoFe. The antiparallel coupling layer 353 may include material such as Ru and the antiferromagnetic material layer 351 may include material such as IrMn, PtMn, etc. In some embodiments, the nonmagnetic layer 355 may be electrically conducting spacer such as Cu.

As presented above with respect to FIG. 1B, the modulation of the oscillation frequency may be determined by measuring the changes to the electrical resistance of the sensor stack 317 responsive to changes to the external magnetic field, e.g., changes to the magnitude, orientation, or any combination thereof. For example, the electrical resistance of the nonmagnetic layer 355 changes as the orientation and magnitude of magnetization of the free magnetization layer 356 changes relative to the orientation and magnitude of the magnetization of the reference layer 354. Accordingly, measuring the changes to the electrical resistance can be used to determine the modulation of the oscillation frequency and ultimately the magnitude and orientation of the external magnetic field.

It is appreciated that exchange coupling between the antiferromagnetic material layer 351 and the magnetic pinned layer 352 pins the magnetization of the magnetic pinned layer 352 in an orientation that is perpendicular to the orientation of the external magnetic field. Moreover, antiparallel coupling between the magnetic pinned layer 352 and the reference layer 354 pins the magnetization of the reference layer 354 in the orientation opposite but parallel to the that of magnetic pinned layer 352. The free magnetization layer 357 therefore has a magnetization that is parallel to the orientation of the external magnetic field. It is appreciated that the biasing may be provided through one or both of the magnetic biasing layers 313 and 314.

In some embodiments, current generated based on the received microwave output signal is applied to the antiferromagnetic material layer 351. As such, electrons flow through the antiferromagnetic layer 351, the magnetic pinned layer 352, the antiparallel coupling layer 353, the reference layer 354, the nonmagnetic layer 355 and the free magnetization layer 356. Electrons flowing through the layers are polarized by the magnetization of each layer. The polarization applies a torque to the free magnetization layer 356. The electrical resistance of the nonmagnetic layer 355 changes as the orientation and magnitude of magnetization of the free magnetization layer 356 changes relative to the orientation and magnitude of the magnetization of the reference layer 354. For example, the more parallel the magnetization of the reference layer 354 and the free magnetization layer 356 are together the lower the electrical resistance is and vice versa.

Figure 2:
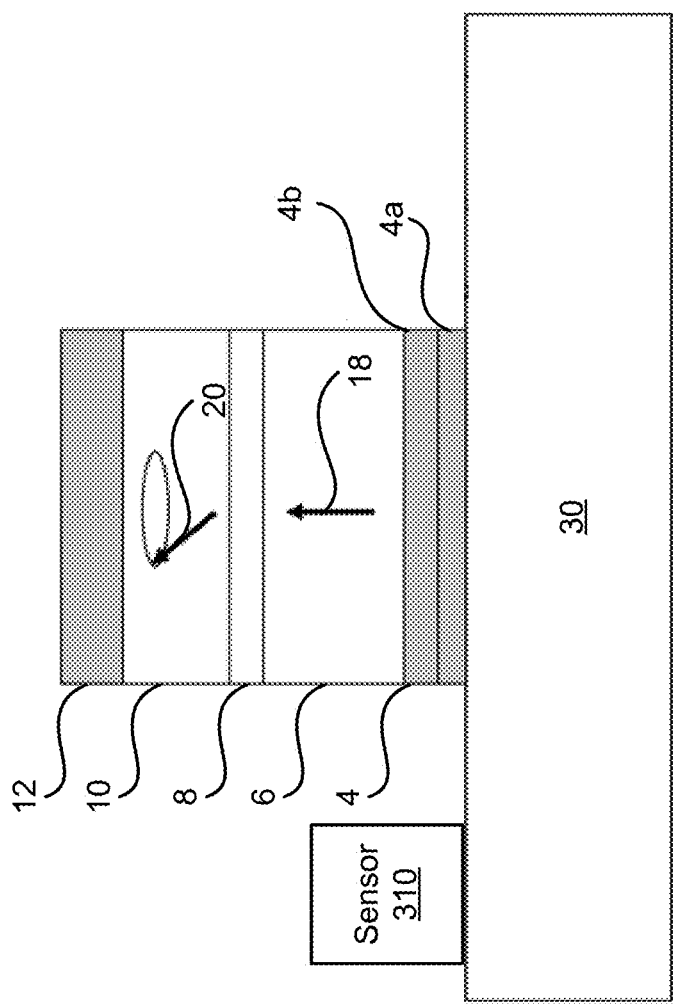
FIG. 2 provides a schematic diagram of a spin torque oscillation generator formed over a substrate and a sensor for detecting magnitude and direction of a magnetic field according to one aspect of the present description.

Referring now to FIG. 2, a schematic diagram of a spin torque oscillation generator formed over a substrate and a sensor for detecting magnitude and direction of a magnetic field in accordance with some embodiments is shown. The substrate 30A can include any suitable substrate material, such as a glass, metal, silicon (e.g., single crystalline silicon with (100) orientation) and/or other suitable substrate material. In some embodiments, the first electrode 4 is divided into a first electrode layer 4a and a second electrode layer 4b. The first electrode layer 4a can comprise any suitable electrode material deposited over the substrate 30A, such as, for example, a silver-alloy, copper-alloy, gold-alloy, aluminum alloy, and/or other suitable electrode material. In some embodiments, the first electrode layer 4a includes an FCC, BCC, and/or HCP seed layer. The second electrode layer 4b can include an intermediate layer of a ruthenium-alloy, such as Ru, RuCr, and/or RuX, where X stands for any other suitable element or mixture of elements. In some embodiments, the second electrode layer 4b includes a HCP structure. In some embodiments, the spin reference layer 6 includes an HCP structure, for example, a CoPt-alloy, such as, CoPt, CoCrPt, or CoCrPtX, where X stands for any other suitable element or a mixture of any other suitable elements. The thickness of the spin reference layer 6 can range from about 1 nm to about 1000 nm. In some embodiments, the exchange break layer 8 includes an FCC structure-material having a high electrical conductivity, such as, Au-alloys, Pt-alloys, Cu-alloys, Ag-alloys, Al-alloys, and/or other suitable alloys with or without addition of other suitable elements. The thickness of the exchange break layer 8 can range from about 0.5 nm to about 100 nm. In some embodiments, the spin oscillation layer 10 includes a soft magnetic material, such as NiFe, CoFe, NiCo, or NiCoFe alloys (with or without the addition of other suitable elements) and/or negative Ku alloys, such as, Co—Ir alloys (with or without the addition of other suitable elements).

In some embodiments, the substrate 30 includes a single crystalline Si substrate (111). One or more high electrical conductivity materials, such as Au, Pt, Ag, Al, and/or suitable alloys thereof, are deposited onto the Si (111) substrate 30A as a seed layer 4a to provide a FCC (111) crystalline thin film. A Ru seed layer 4b can be subsequently deposit onto the seed layer 4a to obtain a Ru (0002) single crystalline thin film. The seed layers 4a, 4b form a first electrode 4. In some embodiments, a layer of permanent magnetic CoPtX alloy, where X can be any suitable element or mixture of elements, having a high magnetic anisotropy is deposited to form a spin reference layer 6. The spin reference layer 6 can include a single crystalline thin film having a (0002) structure and a first magnetic orientation 18. In some embodiments, an exchange breaking layer 8 having a high electrical conductivity, such as, for example, Au, Pt, Ag, Al and/or suitable alloys thereof, is deposited onto the spin reference layer 6. The exchange breaking layer 8 includes a single crystalline thin film having (111) structure. In some embodiments, a spin oscillation layer 10 of $L1_0$-phased FePtX alloy, where X is any suitable element or mixture of elements, is deposited onto the exchange breaking layer 8. The spin oscillation layer 10 includes a single crystalline permanent magnetic thin film having a (111) structure. In some embodiments, the spin reference layer 6 has a first magnetic orientation 18 (e.g., a magnetic easy axis) oriented on a film normal and the spin oscillation layer 10 has a second magnetic orientation (e.g., a magnetic easy axis) 54.75 degree away from a film normal in three existing (110) planes.

The spin torque oscillation generator 2 can have dimensions on a nano and/or micro level scale. For example, in some embodiments, the spin torque oscillation generator 2 is a solid state microwave generator having a lateral dimension of about 20 nm×20 nm. The spin torque oscillation generator 2 be made into arrays with a 40 nm lateral pitch (e.g., 20 nm spin toque oscillation generators 2 having a 20 nm spacing to one or more adjacent spin torque oscillation generators 2 (see FIG. 6)). The spin torque oscillation generator 2 can be configured to generate a spin torque output signal in the microwave range. In some embodiments, the spin torque oscillation generator 2 generates a spin torque output signal having about 0.1 nW of microwave energy, although it will be appreciated that a spin torque oscillation generator 2 having greater and/or lesser dimensions can be configured to output a higher or lower energy. In some embodiments, a plurality of spin torque oscillation generators 2 can be combined to generate a microwave output signal of any desired strength. In some embodiments, a nanometer sized spin torque oscillation generator 2 provides one or more advantages over a micrometer-sized spin torque oscillation generator 2. For example, in some embodiments, the smaller cross-section provides a larger ratio of surface to volume of a metal line which provides better thermal dissipation, although it will be appreciated that nanometer and/or micrometer-sized spin torque oscillation generators 2 can provide additional and/or alternative benefits. The spin torque oscillation generator 2 provides several advantages over traditional microwave generators (such as Gunn diodes), such as smaller size (e.g., spin torque oscillation generator 2 can have an area of about 20 nm versus a 1 cm Gunn diode), broad working temperatures, low dissipation power, large output power, microwave emissions without a magnetic field, high frequencies, and narrow line width, to name just a few. The smaller size of the spin torque oscillation generator 2 (as compared to traditional microwave generators) makes the spin torque oscillation generator 2 ideal for space-restricted uses, such as, for example, medical imaging, tracking, cell phones, solid state devices, and/or any other space-restricted or space-dependent application.

It is appreciated that the sensor 310 may be disposed on the substrate 30A. The sensor 310 is described in FIGS. 1A-1C. The sensor 310 receives a current generated based on received the microwave output signal. As presented above, the electrical resistance associated with the sensor 310 changes in response to changes in the external magnetic field, e.g., magnitude, orientation, etc. In other words, the electrical resistance of the sensor 310 is different when the microwave output signal is received in presence and in absence of the external magnetic field and as the magnitude and/or orientation of the external magnetic field changes. The measured change in electrical resistance of the sensor 310 is used by the processing unit 320 to determine the modulation of the oscillation frequency which is related to the magnitude and orientation of the external magnetic field.

Figure 3:
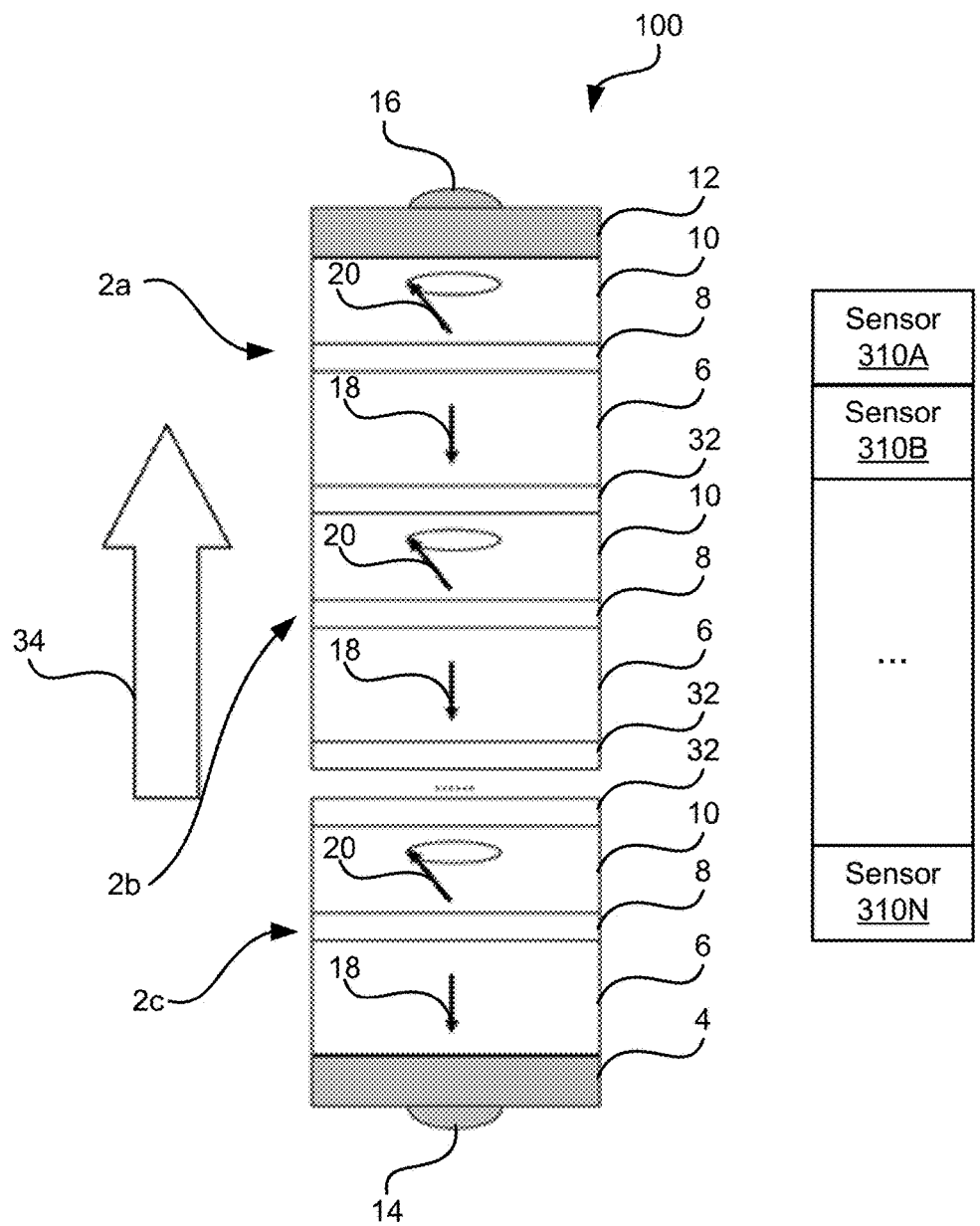
FIG. 3 illustrates a schematic diagram of an array of stacked spin torque oscillation generators and sensors for detecting magnitude and direction of a magnetic field according to one aspect of the present description.

Referring now to FIG. 3, a schematic diagram of an array of stacked spin torque oscillation generators 100 and sensors for detecting magnitude and direction of a magnetic field in accordance with some embodiments is shown. The stacked microwave generator 100 includes a first spin torque oscillation generator 2a, a second spin torque oscillation generator 2b, and an n-th spin torque oscillation generator 2c. Although three spin torque oscillation generators 2a-2c are illustrated, it will be appreciated that the stacked microwave generator 100 can include any number of vertically stacked spin torque oscillation generators 2. The spin torque oscillation generators 2a-2c are similar to the spin torque oscillation generators 2 illustrated in FIGS. 1-2, and similar description is not repeated herein. In some embodiments, the stacked microwave generators 2a-2c are generated by a lithographic method, a bit-pattern media method, a nano-imprinting method (e.g., using self-organized di-block polymers), and/or any other suitable method.

In some embodiments, the spin torque oscillation generators 2a-2c are separated by additional exchange breaking layers 32 positioned between a spin reference layer 6 of a first spin torque oscillation generator 2a-2c and a spin oscillation layer 10 of a second spin torque oscillation generator 2a-2c. A current is applied at a first electrode 4 and passed through each of the spin oscillation generators 2a-2c. Each of the spin torque oscillation generators 2a-2c are configured to generate spin torque output signals that are substantially additive. For example, in some embodiments, the first magnetization direction 18 of the spin reference layer 6 in each of the spin torque oscillation generators 2a-2c is substantially equal and the second magnetization direction 20 of the spin oscillation layer 10 in each of the spin torque oscillation generators 2a-2c is substantially equal. In other embodiments, although the first magnetization direction 18 and/or the second magnetization direction 20 in each of the spin torque oscillation generators 2a-2c may be different, the magnetization angle difference between the first magnetization direction 18 and the second magnetization direction 20 in each of the spin torque oscillation generators 2a-2c is substantially the same. In other embodiments, the first magnetization direction, the second magnetization direction, and/or the magnetization angle in each of the spin torque oscillation generators 2a-2c can be different from one another. In this embodiment, the spin torque output signals generated by each of the spin torque oscillation generators may only be partially additive. The spin torque output signals of each of the spin torque oscillation generators 2a-2c are aggregated to generate an output signal, such as a microwave output signal.

In some embodiments, the second magnetization direction 20 of each of the spin oscillation layers 10 can be determined by an external magnetic field 34 applied to the stacked microwave generator 100. The external magnetic field 34 can be generated by any suitable magnetic element, such as, for example, a permanent magnet, an electromagnetic, a current path, and/or any combination thereof. The external magnetic field 34 is configured to align at least the second magnetization direction 20 of each of the spin oscillation layers 10 in a predetermined direction. For example, in some embodiments, the external magnetic field 34 aligns the second magnetization direction 20 of each of the spin torque oscillation generators 2a-2c in the same direction. In some embodiments, each of the spin reference layers 6 comprise a hard magnetic material configured to maintain a predetermined first magnetization direction 18, even when exposed to an external magnetic field 34. In other embodiments, the spin reference layers 6 each comprise a material having a different response to an external magnetic field 34.

In some embodiments, the external magnetic field 34 is an adjustable magnetic field. One or more parameters of the external magnetic field 34, such as, for example, the strength of the field, the direction of the field, the location of the field, and/or additional parameters can be adjusted to alter the second magnetization direction 20 of the spin oscillation layer 10. For example, in some embodiments, the external magnetic field 34 is generated by an electromagnet and has an adjustable magnetization direction. The direction of the external magnetic field 34 can be adjusted to provide a predetermined magnetic angle difference between the first magnetization direction 18 of the spin reference layer 6 and the second magnetization direction 20 of the spin oscillation layer 10. In various embodiments, the magnetic angle difference can be adjusted to any suitable degree within the range of 0° and 90°, such as 5°, 10°, 15°, 30°, 45°, 60°, 75°, 80°, 85°, 90°, a range of 0° and 180°, such as 5°, 10°, 15°, 30°, 45°, 60°, 75°, 80°, 85°, 90°, 105°, 135°, 150°, 180°, and/or any other suitable angle or range of angles. In some embodiments, the external magnetic field 34 is adjusted to alter a frequency of an output signal generated by the spin oscillation layer 10. In some embodiments, the external magnetic field 34 can include two or more magnetic fields. For example, in some embodiments, individual external magnetic fields are applied to each of the spin torque oscillation generators 2a-2c. The external magnetic fields are configured to partially overlap only the spin oscillation layer 10 of an associated spin torque oscillation generator 2a-2c without interfering with the spin oscillation layer 10 of adjacent spin torque oscillation generators 2a-2c. In some embodiments, multiple external magnetic fields can overlap one or more of the spin oscillation layers 10.

It is appreciated that the external magnetic field 34, presented above, is a controlled magnetic field to generate the appropriate microwave output signal. However, additional external magnetic fields, e.g., external magnetic field 35, may be present and are uncontrolled. One or more sensors 310A-310N may be used to determine the magnitude and/or orientation of the external magnetic field 35, as presented above. It is appreciated that in this embodiment, multiple sensors are used. Each sensor may be positioned at a different distance and orientation angle with respect to the spin torque oscillation generators 2a-2c such that each sensor may receive a different signal strength and at a different orientation. As such, presence of the external magnetic field 35 impacts each sensor differently. Accordingly, different changes in electrical resistances of the sensors 310A-310N can be used by the processing unit 320 to more precisely measure the magnitude and orientation of the external magnetic field 35.

Figure 4:
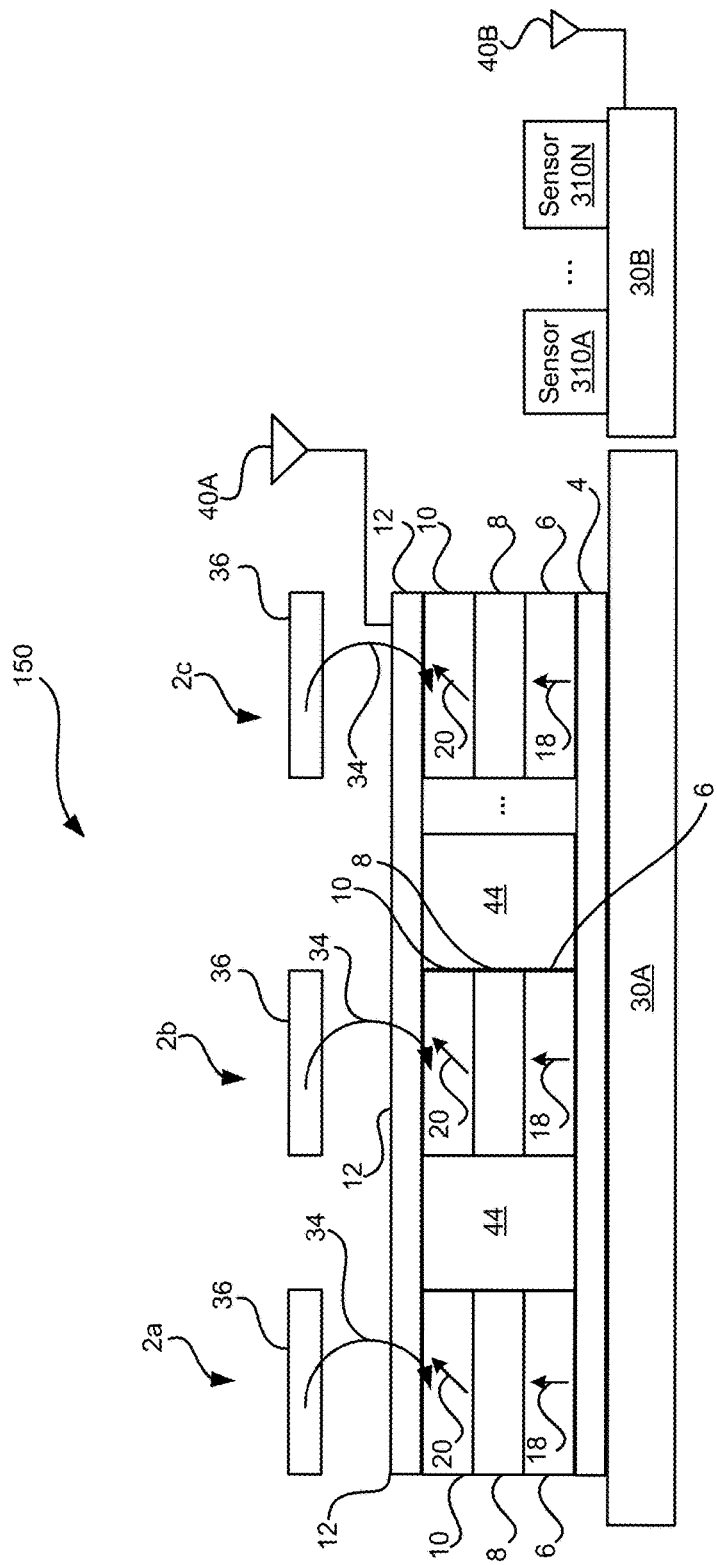
FIG. 4 illustrates a schematic diagram of an array of side-by-side spin torque oscillation generators and sensors for detecting magnitude and direction of a magnetic field according to one aspect of the present description.

Referring now to FIG. 4, a schematic diagram of an array 150 of side-by-side spin torque oscillation generators 2a-2c and sensors for detecting magnitude and direction of a magnetic field in accordance with some embodiments is shown. The spin torque oscillation generators 2a-2c are similar to the spin torque oscillation generator 2 described in conjunction with FIG. 1, and similar description is not repeated herein. The first electrode 4 and the second electrode 12 each include a continuous thin film coupled to each of the spin torque oscillation generators 2a-2c. The spin torque oscillation generators 2a-2c are arranged in an adjacent configuration on a substrate 30A and are coupled in parallel. In some embodiments, the spin torque oscillation generators 2a-2c are separated by one or more insulators 44. The insulators 44 can include thermal conducting single crystal or polycrystalline oxide(s) that electrically insulate the current in each of the spin torque oscillation generators 2a-2c. The insulators 44 efficiently dissipate ohm heating of the spin torque oscillation generators 2a-2c under high current density. Each of the spin torque oscillation generators 2a-2c may have a corresponding a magnetic element 36 associated therewith in order to apply the external magnetic field to the spin torque oscillation generator in order to align the second magnetization direction 20 of an associated spin oscillation layer 10 in a predetermined direction. The magnetic element 36 is configured to generate an external magnetic field 34 that at least partially overlaps the spin oscillation layer 10 of the associated spin torque oscillation generators 2a-2c. Although individual magnetic elements 36 are illustrated, it will be appreciated that one or more of the spin torque oscillation generators 2a-2c can share one or more continuous and/or discrete magnetic generators.

Each of the magnetic elements 36 is configured to align the second magnetization direction 20 of an associated spin oscillation layer 10 in a predetermined direction. For example, in some embodiments, each of the magnetic elements 36 is configured to align the second magnetization direction 20 of each of the spin torque oscillation generators 2a-2c in substantially the same direction. In some embodiments, each of the magnetic elements 36 provides an adjustable external magnetic field 34 such that the second magnetization direction 20 of each of the spin oscillation layers 10 (and therefore the electromagnetic wave output signal) can be adjusted independently. In some embodiments, each of the magnetic elements 36 are independently adjusted such that a magnetization angle between the first magnetization direction 18 and the second magnetization direction 20 in each of the spin-torque oscillation generators 2a-2c are substantially equal. In various embodiments, the magnetization angle between the first magnetization direction 18 and the second magnetization direction 20 in each of the spin torque oscillation generators 2a-2c can be any angle within the range of 0° to 180°, such as 5°, 10°, 15°, 30°, 45°, 60°, 75°, 90°, 120°, 150°, 180°, and/or any other suitable angle.

In some embodiments, the spin torque oscillation generators 2a-2c are coupled to a transmitter 40A configured to transmit an aggregate microwave output signal. The aggregate microwave output signal is generated by combining the electromagnetic wave output signals of each of the spin torque oscillation generates 2a-2c. In some embodiments, the transmitter 40A can include a microwave cavity, a waveguide, and/or any other suitable transmission elements.

The microwave output signal may be received by a receiver 40B associated with sensors 310A-310N. Sensors 310A-310N may be disposed on a substrate 30B. It is appreciated that substrate 30B may be similar to substrate 30A. It is appreciated that more than one receiver may be used and discussion with respect to one receiver 40B is for illustration purposes and should not be construed as limiting the scope of the embodiments. As presented above, the received microwave output signal by the receiver 40B generates a current that is applied to each of the sensors 310A-N. As presented above, changes to the external magnetic field changes the electrical resistance of each of the sensors 310A-N which can be measured. The measured changes to the electrical resistances of the sensors 310A-N can be used by the processing unit 320 to determine the modulation of the oscillation frequency which is related to the magnitude and orientation of the external magnetic field.

Figure 5:
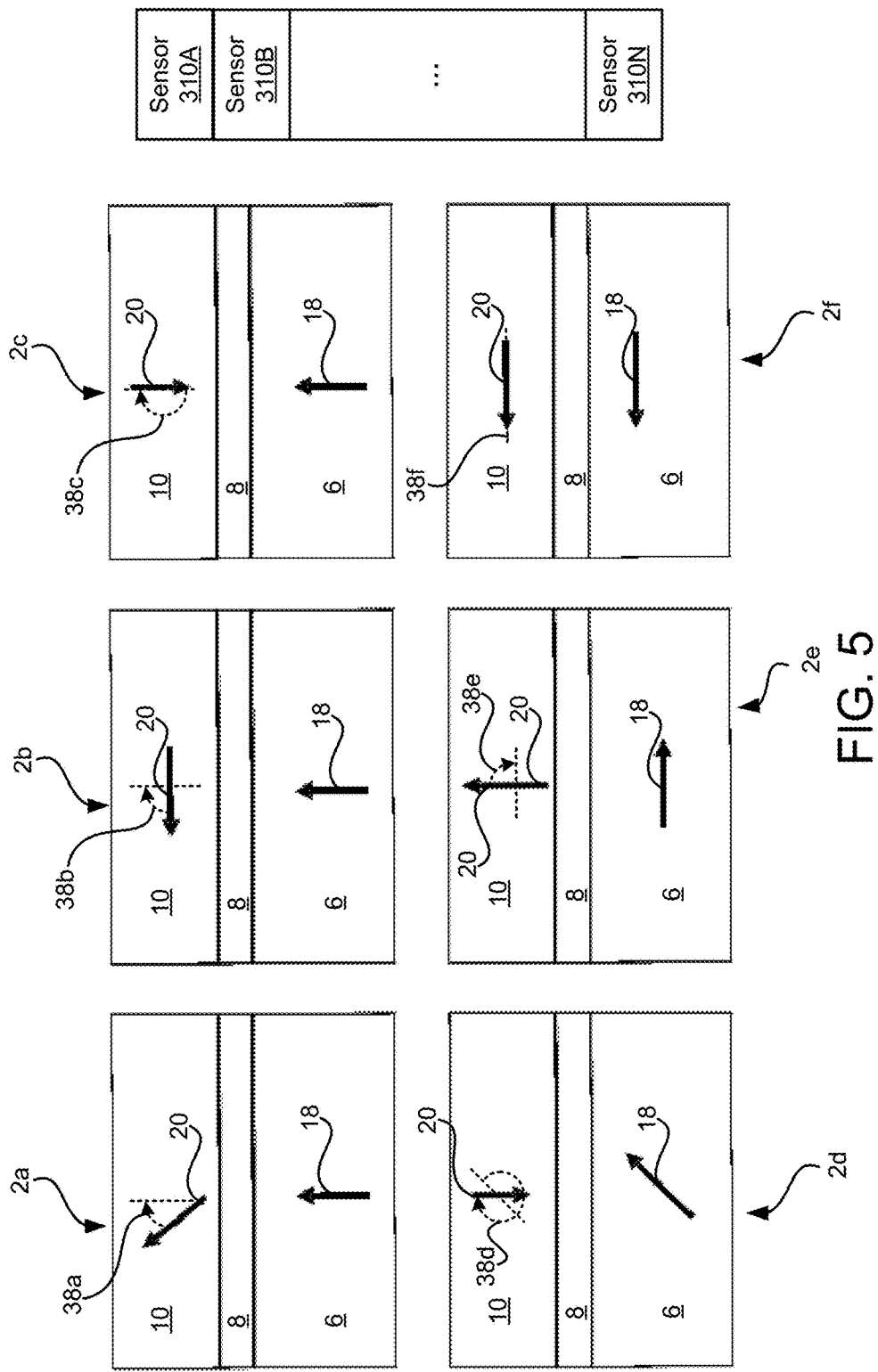
FIG. 5 illustrates a schematic diagram of various spin torque oscillators having a plurality of first and second magnetization directions and sensors for detecting magnitude and direction of a magnetic field according to one aspect of the present description.

Referring now to FIG. 5, a schematic diagram of various spin torque oscillators 2a-2f having a plurality of first and second magnetization directions 18, 20 and sensors for detecting magnitude and direction of a magnetic field in accordance with some embodiments is shown. As shown in FIG. 5, magnetic decoupling between the spin reference layer 6 and the spin oscillation layer 10 (for example, as provided by the exchange breaking layer 8) allows the spin torque oscillation generator 2a-2f to generate a spin torque output signal at any magnetization angle within the range of 0° to 180°. For example, the first spin torque oscillation generator 2a, second spin torque oscillation generator 2b, and the third spin torque oscillation generator 2c each have a first magnetization direction 18 in an "up" direction. The first spin torque oscillation generator 2a has a second magnetization direction 20 offset at a substantially 45° angle (magnetization angle 38a), the second spin torque oscillation generator 2b has a second magnetization direction 20 offset at substantially a 90° angle (magnetization angle 38b), and the third spin torque oscillation generator 2c has a second magnetization direction 20 offset at substantially a 180° angle (magnetization angle 38c).

In some embodiments, the first magnetization direction 18 can vary between spin torque oscillation generators 2a-2f. For example, the fourth spin torque oscillation generator 2d has a first magnetization direction 18 offset at a 45° angle from an "up" direction and a second magnetization direction 20 in a substantially "down" direction, providing a magnetization angle 38d of about 135°. As another example, the fifth spin torque oscillation generator 2e has a first magnetization direction in a substantially "right" direction and a second magnetization direction 20 in a substantially "up" direction, providing a magnetization angle 38e of about 90°. As a third example, the sixth spin torque oscillation generator 2f has a first magnetization direction in a substantially "left" direction and a second magnetization direction 20 in a substantially "left" direction, providing a magnetization angle 38e of about 0°. Although various illustrative embodiments of first magnetization directions 18 and second magnetization directions 20 are provided herein, it will be appreciated that the first magnetization direction 18 and/or the second magnetization direction can have any orientation and have any angle of difference within a range of 0° to 180°. It is appreciated that the output of each spin torque oscillation generator may be combined with other in any desired configuration, e.g., parallel, series, or any combination thereof.

The microwave output signal may be received by sensors 310A-310N. As presented above, the received microwave output signal generates a current that is applied to each of the sensors 310A-N. As presented above, changes to the external magnetic field changes the electrical resistance of each of the sensors 310A-N which can be measured. The measured changes to the electrical resistances of the sensors 310A-N can be used by the processing unit 320 to determine the modulation of the oscillation frequency which is related to the magnitude and orientation of the external magnetic field.

Figure 6:
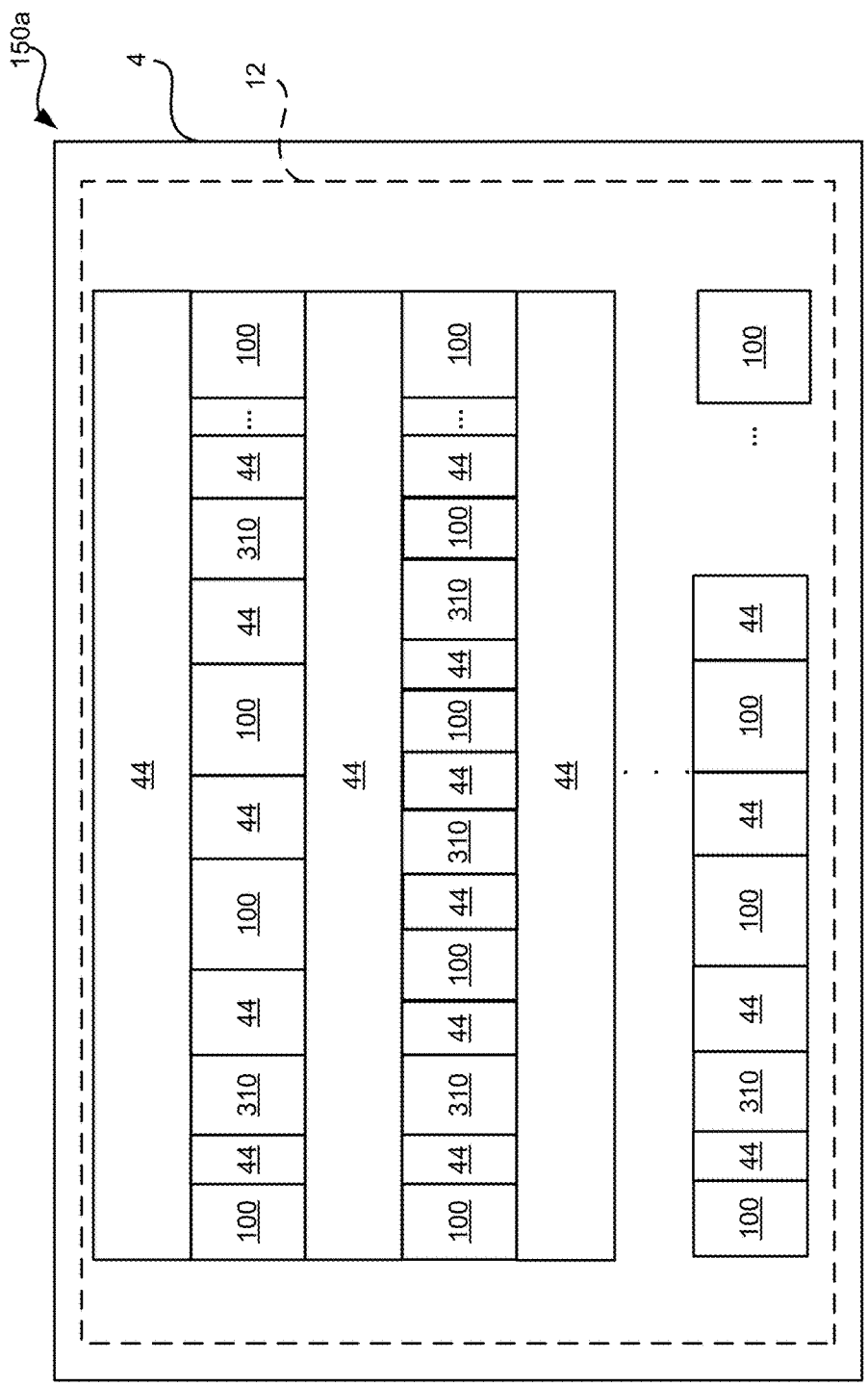
FIG. 6 illustrates a schematic diagram of a grid-array of stacked spin torque oscillation generators and sensors for detecting magnitude and direction of a magnetic field according to one aspect of the present description.

Referring now to FIG. 6, a schematic diagram of a grid-array 150a of stacked spin torque oscillation generators 100 and sensors for detecting magnitude and direction of a magnetic field in accordance with some embodiments is shown. The stacked microwave generators 100 are similar to the stacked microwave generator 100 described in conjunction with FIG. 3, and similar description is not repeated herein. The stacked sensors 310 are similar to the stacked sensors 310A-310N described in conjunction with FIGS. 1A-1C, and 2-5. A first electrode 4 and a second electrode 12 (shown in phantom) of the grid-array 150a includes a continuous thin-film that couples each of the stacked microwave generators 100 and sensors 310 in parallel. An insulator 44 can be located between each of the stacked microwave generators 100 and sensors 310 to electrically isolate each of the stacked microwave generators 100 and sensors 310. In some embodiments, each of the stacked microwave generators 100 include spin torque oscillation generators 2a-2c configured to generate a substantially similar spin torque output signal such that the microwave output of each of the stacked microwave generators 100 is additive. For example, for a 1 in ×1 in array having a pitch of 40 nm, there are about 4×10$^{10}$ spin-torque oscillation generators 2 in a single layer. In some embodiments, each of the spin torque oscillation generators 2 generate 0.1 nW of microwave energy. A single layer of the 1 in ×1 in array provides 40 W of microwave energy. For a 3D stacked grid-array 100b having, for example, 100 layers, a 4 kW microwave output signal can be generated. As another example, for micro-sized applications, a 10 micrometer×10 micrometer array having a pitch of 40 nm and 100 layers can generate a microwave output signal of about 0.6 mW. It will be appreciated that the numbers provided herein are illustrative only and that any number of layers, in any sized array, using any suitable pitch, can generate a greater or smaller microwave output signal and is within the scope of this disclosure.

Figure 7:
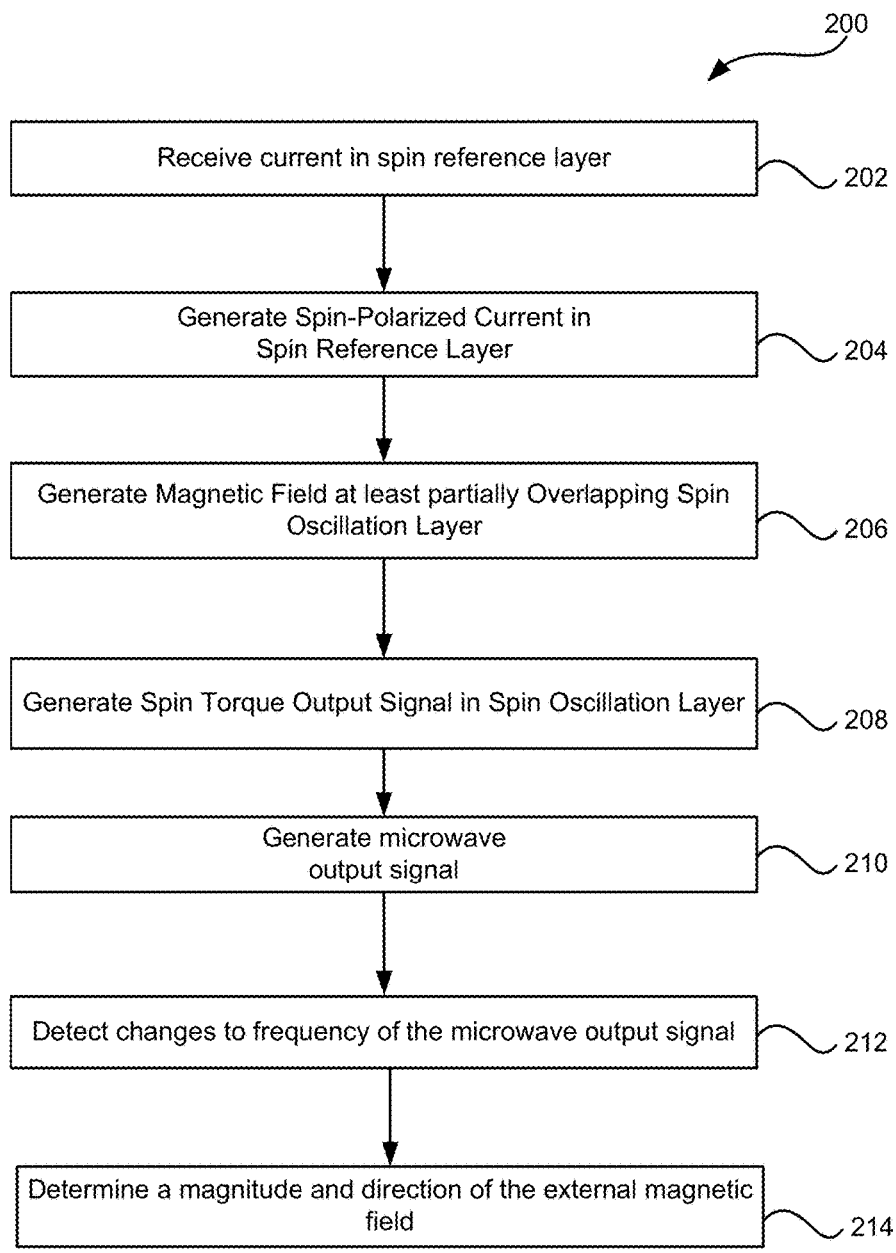
FIG. 7 illustrates flow diagram for generating a microwave output signal using a first spin torque oscillation generator and a second spin torque oscillation generator to determine the magnitude and orientation of a magnetic field according to one aspect of the present description.

Referring now to FIG. 7, flow diagram 200 for generating a microwave output signal using a first spin torque oscillation generator and a second spin torque oscillation generator to determine the magnitude and orientation of a magnetic field in accordance with some embodiments is shown. At 202, a current is received at a spin reference layer 6. The current 22 can be received from a first electrode 4 coupled to the spin reference layer 6. The spin reference layer 6 may be a permanent magnetic material having a first magnetization direction 18. At 204, a spin-polarized current is generated by filtering the current 22 through the spin reference layer 6. The spin reference layer 6 filters the current 22 by allowing electrons having a spin direction substantially the same as the first magnetization direction 18 to pass through while reflecting electrons having a spin direction substantially opposite the first magnetization direction 18.

At 206, an external magnetic field 34 can be generated and applied to a spin oscillation layer 10. The external magnetic field 34 can be generated by any suitable magnetic element, such as a permanent magnet, an electromagnet, a current wire, and/or any other suitable element. The magnetic field 34 aligns a second magnetization direction of the spin oscillation layer 10 in a predetermined direction such that an angle of difference between the first magnetization direction 18 and the second magnetization direction is within a range of 0° to 180°. In some embodiments, the external magnetic field 34 is omitted.

At 208, an electromagnetic wave output signal is generated in the spin oscillation layer 10. The spin torque output signal is generated by providing the spin-polarized current to the spin oscillation layer 10. The spin-polarized current generates a spin torque on the spins in the spin oscillation layer 10. The spin torque is related to an angle of difference between the first magnetization direction 18 of the spin reference layer 6 and the second magnetization direction 20 of the spin oscillation layer 10. The spin torque causes precession of the spins within the spin oscillation layer 10. The precession of the spins generates electromagnetic wave output signal. At step 210, a microwave output signal is generated by aggregating each of the electromagnetic wave output signals generated by the first and second spin torque oscillation generators.

At step 212, changes to the frequency of the microwave output signal is detected. For example, a current associated with the received microwave output signal is generated and applied to sensor. The electrical resistance of the sensor changes as the external magnetic field changes. The changes to the frequency of the microwave output signal is related to the electrical resistance of the sensor and changes thereof. At step 214, the magnitude and/or orientation/direction of the external magnetic field may be determined using the determined changes to the frequency of the microwave output signal.

While some particular embodiments have been described and/or illustrated herein, and while these particular embodiments have been described and/or illustrated in considerable detail, it is not the intention of the applicant(s) for these particular embodiments to limit the concepts presented herein. Additional adaptations and/or modifications may readily appear to persons having ordinary skill in the art, and, in broader aspects, these adaptations and/or modifications may be encompassed as well. The implementations described above and other implementations are within the scope of the following claims.

What is claimed is:
1. An apparatus comprising:
    a spin torque oscillator configured to receive a current and to generate a microwave output signal;
    a sensor configured to detect the microwave output signal and to detect changes to frequency of the detected microwave output signal responsive to changes an external magnetic field, wherein the sensor comprises:
        an antiferromagnetic layer receiving a current associated with the microwave output signal that is detected by the sensor, wherein the current associated with the microwave output signal is received through a lead;
a magnetic pinned layer disposed over the antiferromagnetic layer, wherein exchange coupling between the magnetic pinned layer and the antiferromagnetic layer exchange creates a magnetization in a first direction within the magnetic pinned layer, wherein the magnetic pinned layer receives the current associated with the microwave output signal from the antiferromagnetic layer;
a reference layer disposed over the magnetic pinned layer, wherein antiparallel coupling between the reference layer and the magnetic pinned layer creates another magnetization in a second direction within the reference layer, wherein the reference layer polarizes spin of electrons of the current associated with the microwave output signal received from the magnetic pinned layer; and
a free magnetization layer disposed over the reference layer, wherein the polarized electrons apply a torque to the free magnetization layer; and
a processing unit configured to receive a sensed signal from the sensor, wherein the processing unit is further configured to process the sensed signal and the changes to the frequency to determine magnitude and direction associated with the external magnetic field.

2. The apparatus of claim 1, wherein the spin torque oscillator comprises:
a spin reference layer having a first magnetization direction, wherein the spin reference layer is configured to receive the current and to generate a spin-polarized current; and
a spin oscillation layer having a second magnetization direction, wherein the second magnetization direction is different than the first magnetization direction, wherein the spin oscillation layer is configured to receive the spin-polarized current from the spin reference layer, wherein the spin-polarized current generates a spin torque based on the second magnetization direction of the spin oscillation layer, and wherein the spin torque generates the microwave output signal.

3. The apparatus of claim 2 further comprising:
an exchange breaking layer configured to magnetically decouple the spin reference layer from the spin oscillation layer.

4. The apparatus of claim 2, wherein the external magnetic field partially overlaps the spin oscillation layer, and wherein the second magnetization direction is aligned in a same magnetization direction as the external magnetic field.

5. The apparatus of claim 2, wherein a frequency associated with the microwave output signal is adjustable by varying a density associated with the current.

6. The apparatus of claim 2, wherein the spin reference layer generates a spin-polarized current by filtering electrons having a first spin direction substantially similar to the first magnetization direction and scattering electrons having a second spin direction substantially opposite to the first magnetization direction.

7. The apparatus of claim 2, wherein the spin reference layer is selected from the group consisting of a copper-platinum alloy, and an iron-platinum alloy, and wherein the spin oscillation layer is selected from the group consisting of a nickel-alloy, an iron-alloy, and a cobalt-alloy.

8. The apparatus of claim 1, wherein the sensor detects a change in orientation of a rotational axis oscillation frequency of a magnetization of a magnetic layer in response to changes in orientation of the external magnetic field.

9. The apparatus of claim 1, wherein the processing unit is configured to measure resistance across an antiferromagnetic layer, a magnetic pinned layer, a reference layer, and a free magnetization layer, and wherein the resistance changes responsive to changes in orientation and magnitude of the external magnetic field.

10. The apparatus of claim 9, wherein the resistance changes responsive to changes in orientation and magnitude of magnetization of the free magnetization layer.

11. The apparatus of claim 9, wherein the changes to the frequency is measured by measuring the changes to the resistance.

12. The apparatus of claim 1 further comprising a transmitter coupled to spin torque oscillator to transmit the microwave output signal.

13. A system comprising:
a first spin torque oscillation generator configured to generate a first microwave output signal;
a second spin torque oscillation generator configured to generate a second microwave output signal, wherein the first microwave output signal is combined with the second microwave output signal to form a resultant microwave output signal;
a transmitter coupled to the first spin torque oscillation generator and the second spin torque oscillation generator, wherein the transmitter is configured to output the resultant microwave output signal;
a sensor configured to detect the resultant microwave output signal and to detect changes to frequency of the detected resultant microwave output signal responsive to changes in an external magnetic field, wherein the sensor comprises:
an antiferromagnetic layer receiving a current associated with the microwave output signal that is detected by the sensor, wherein the current associated with the microwave output signal is received through a lead;
a magnetic pinned layer disposed over the antiferromagnetic layer, wherein exchange coupling between the magnetic pinned layer and the antiferromagnetic layer exchange creates a magnetization in a first direction within the magnetic pinned layer, wherein the magnetic pinned layer receives the current associated with the microwave output signal from the antiferromagnetic layer;
a reference layer disposed over the magnetic pinned layer, wherein antiparallel coupling between the reference layer and the magnetic pinned layer creates another magnetization in a second direction within the reference layer, wherein the reference layer polarizes spin of electrons of the current associated with the microwave output signal received from the magnetic pinned layer; and
a free magnetization layer disposed over the reference layer, wherein the polarized electrons apply a torque to the free magnetization layer; and
a processing unit configured to receive a sensed signal from the sensor, wherein the processing unit is further configured to process the sensed signal and the changes to the frequency to determine magnitude and direction associated with the external magnetic field.

14. The system of claim 13, wherein the first spin torque oscillation generator and the second spin torque oscillation generator each comprise:

a spin reference layer having a first magnetization direction, the spin reference layer configured to receive a current and generate a spin-polarized current; and a spin oscillation layer having a second magnetization direction, wherein the second magnetization direction is different than the first magnetization direction, wherein the spin oscillation layer is configured to receive the spin-polarized current from the spin reference layer, wherein the spin-polarized current generates a spin torque based on the second magnetization direction of the spin oscillation layer, and wherein the spin torque generates a microwave output signal, wherein a first magnetization angle between the first magnetization direction and the second magnetization direction of the first spin torque oscillation generator and a second magnetization angle between the first magnetization direction and the second magnetization direction of the second spin torque oscillation generator are configured such that the first microwave output signal the second microwave output signal are substantially additive.

15. The system of claim 14, wherein first magnetization angle is substantially equal to the second magnetization angle.

16. The apparatus of claim 14, wherein each of the first and second spin torque oscillation generators comprises an exchange breaking layer configured to magnetically decouple the spin reference layer from the spin oscillation layer.

17. The apparatus of claim 14, wherein the external magnetic field at least partially overlaps the spin oscillation layer of each of the first and second spin torque oscillation generators, and wherein the second magnetization direction is determined by the external magnetic field.

18. The apparatus of claim 13, wherein the first spin torque oscillation generator and the second spin torque oscillation generator are coupled in series.

19. The system of claim 13 further comprising:

another sensor configured to detect the resultant microwave output signal and to detect changes to frequency of the detected resultant microwave output signal responsive to changes in the external magnetic field, wherein the processing unit is further configured to utilize positional difference between the sensor and the another sensor and respective readings thereof to determine orientation and magnitude of the external magnetic field.

20. The system of claim 13, wherein the processing unit is configured to measure resistance across an antiferromagnetic layer, a magnetic pinned layer, a reference layer, and a free magnetization layer, and wherein the resistance changes responsive to changes in orientation and magnitude of the external magnetic field.

21. The system of claim 20, wherein the resistance changes responsive to changes in orientation and magnitude of magnetization of the free magnetization layer.

22. The system of claim 20, wherein the changes to the frequency is measured by measuring the changes to the resistance.

23. The system of claim 13 further comprising a receiver coupled to the sensor configured to receive the resultant microwave output signal.

* * * * *